US006764796B2

(12) United States Patent
Fries

(10) Patent No.: US 6,764,796 B2
(45) Date of Patent: Jul. 20, 2004

(54) MASKLESS PHOTOLITHOGRAPHY USING PLASMA DISPLAYS

(75) Inventor: David P. Fries, St. Petersburg, FL (US)

(73) Assignee: University of South Florida, Tampa, FL (US)

( * ) Notice: Subject to any disclaimer, the term of this patent is extended or adjusted under 35 U.S.C. 154(b) by 203 days.

(21) Appl. No.: 10/179,540

(22) Filed: Jun. 25, 2002

(65) Prior Publication Data

US 2003/0190535 A1 Oct. 9, 2003

Related U.S. Application Data

(60) Provisional application No. 60/301,218, filed on Jun. 27, 2001.

(51) Int. Cl.[7] .............................. G03F 9/00; G03C 5/00
(52) U.S. Cl. .............................. 430/22; 430/5; 430/313; 430/396; 250/492.1; 250/492.2; 250/492.22; 355/67; 355/77; 378/34; 716/19; 716/21
(58) Field of Search .............................. 430/5, 22, 313, 430/396; 250/492.1, 492.22, 492.2; 355/67, 77; 378/34; 716/19, 21

(56) References Cited

U.S. PATENT DOCUMENTS

| 3,925,677 | A | 12/1975 | Fraser |
| 4,199,688 | A | 4/1980 | Ozasa |
| 5,585,477 | A | 12/1996 | Kilpatrick |
| 5,661,500 | A | 8/1997 | Shinoda et al. |
| 5,691,541 | A | 11/1997 | Ceglio et al. |
| 5,866,913 | A | 2/1999 | Robinson |
| 5,870,176 | A | 2/1999 | Sweatt et al. |
| 5,900,637 | A | 5/1999 | Smith |
| 6,060,224 | A | 5/2000 | Sweatt |
| 6,177,980 | B1 | 1/2001 | Johnson |
| 6,188,519 | B1 | 2/2001 | Johnson |
| 6,238,830 | B1 | 5/2001 | Rangarajan et al. |
| 6,238,852 | B1 | 5/2001 | Klosner |
| 6,251,550 | B1 | 6/2001 | Ishikawa |
| 6,344,715 | B2 | 2/2002 | Tokunaga et al. |
| 6,362,799 | B1 | 3/2002 | Ueoka et al. |
| 6,376,986 | B1 | 4/2002 | Takagi et al. |
| 6,379,867 | B1 | 4/2002 | Mei et al. |

FOREIGN PATENT DOCUMENTS

| EP | 0 971 387 | 1/2000 |
| EP | 1 033 741 | 9/2000 |
| JP | 57017132 | 1/1982 |
| JP | 63086432 | 9/1986 |
| JP | 63196038 | 8/1988 |
| JP | 03030415 | 2/1991 |
| JP | 03034312 | 2/1991 |
| JP | 03174716 | 7/1991 |
| JP | 04042533 | 2/1992 |
| JP | 04192422 | 7/1992 |
| JP | 05029205 | 2/1993 |
| JP | 05190517 | 7/1993 |
| JP | 07022303 | 7/1993 |
| JP | 05259045 | 8/1993 |
| JP | 0 045906 | 7/1994 |
| JP | 06216006 | 8/1994 |
| JP | 08045906 | 2/1996 |
| WO | WO-09804950 | 2/1998 |
| WO | WO-09938187 | 7/1999 |

OTHER PUBLICATIONS

Singh–Gasson et al., "Maskless Fabrication of Light–Directed Oligonucleotide Microarrays Using a Digital Micromirror Array", Nature Biotechnology, 1999, pp. 974–978, vol. 17.

Gibbs, "New Chip Off the Old Block", Scientific American, Sep. 1996, online document, 3 pages.

Johnson, "Micromirror Arrays Perform Photolithography Step", EETIMES, 1999, online document, 5 pages.

Mendoza et al., "High–Throughput Microarray–Based Enzyme–Linked Immunosorbent Assay (ELISA)", Biotechniques, 1999, online document, 1 page.

Dobrowolski et al., "DNA Microarray Technology for Neonatal Screening", Acta Paediatr Suppl, 1999, online document, 1 page.

Nuwaysir et al., "Microarrays and Toxicology; the Advent of Toxicogenomics", Mol Carcinog, 1999, online document, 1 page.

(List continued on next page.)

Primary Examiner—Christopher G. Young
(74) Attorney, Agent, or Firm—Saliwanchik, Lloyd & Saliwanchik

(57) ABSTRACT

The present invention is a maskless photolithography system and method using a plasma display for creating two-dimensional and three-dimensional structures. Advantageously, the invention does not require masks, templates or stencils to create each of the planes or layers on a multi layer two-dimensional or three-dimensional structure. The invention employs a plasma display having individually addressable pixels to generate and direct light onto an object that has photoreactive or photoresist compounds applied to the exposed surface. Unlike conventional plasma displays that generate visible light, the plasma display of the current invention lacks the phosphor coating conventionally used to convert ultraviolet (UV) light to visible light. Therefore, the instant plasma display generates UV light appropriate for reactive processes typically used in photolithography. The desired pattern is designed and stored using conventional computer aided drawing techniques and is used to control the pixels of the plasma display to generate the corresponding desired pattern. Patterned light is directed onto the object to create light and dark spots according to the pattern. In an alternative embodiment, a fixture three dimensions, for mounting of the substrate and allows the substrate to be moved three dimensions, providing alignment in two, coplanar dimensions and the capability to produce three dimensional structures by aligning the substrate in a third dimension perpendicular to the two coplanar dimensions. The system and method is easily reconfigurable and allows rapid prototyping of microscopic and macroscopic devices.

33 Claims, 3 Drawing Sheets

OTHER PUBLICATIONS

Khan et al., "Expression Profiling in Cancer Using cDNA Microarrays", Electrophoresis, 1999, online document, 1 page.

Epstein et al., "Microarray Technology—Enhanced Versatility"; Persistent Challenge, 2000, online document, 1 page.

Romero et al., "Reverse–Transcription Poylmerase Chain Reaction Detection of the Enteroviruses", Arch Pathol Lab Med, 1999, online document, 1 page.

Sellwood et al., "The Use of Reverse Transcriptase–Polymerase Chain Reaction to Investigate Environmental Samples for the Presence of Enteroviruses", Commun Dis Public Health, 1998, online document, 1 page.

Kurian et al., "DNA Chip Technology", J Pathol, 1999, online document, 1 page.

Tanaka et al., "High–Precision Binary Optical Element Fabricated by Novel Self–Aligned Process", Japanese Journal of Applied Physics, 1999, pp 6976–80, vol. 38, No. 12B.

Topper et al., "Low Cost Electroless Copper Metallization of BCB for High–Densisty Wiring Systems", Proceedings International Symposium on Advanced Packaging Materials, 1999, pp 202–8.

Lin et al., "An Improved Heterojunction–Emitter Bipolar Transistor Using Delta–Doped and Spacer Layers", Materials Chemistry and Physics, 1999, pp 91–5, vol. 59, No. 1.

Genolet et al., "Soft, Entirely Photoplastic Probes for Scanning Force Microscopy", Review of Scientific Instruments, 1999, pp 2398–401, vol. 70, No. 5.

Sthel et al., "Testing of Furfuryl Alchohol Resin as a Negative Photoresist", Polymer Testing, 1999, pp 47–50.

Karafyllidis et al., "Modelling and Simulation", Microelectronic Engineering, 1999, pp 71–84, vol. 45, No. 1.

Sekiguchi et al., "Influence of Underlayer Reflection on Optical Proximity Effects In Sub–Quarter Intron Lithography", Proceedings of the SPIE—The International Society for Optical Engineering, 1998, pp 47–55 vol. 3334.

Maeda et al., "ArF Chemically Amplified Negative Resist Using Alicyclic Epoxy Polymer", Journal of Photopolymer Science and Technology, 1998, pp 507–12, vol. 11, No. 3.

Kudo et al., "Optimization of DUV Negative Resists for 0.15 mu m Lithography", Journal of Photopolymer Science and Technology, 1998, pp 445–54 vol. 11, No. 1.

Wallraff et al., "Etch Selectivity of 4SiMA:hydroxystyrene based copolymers. Silicon Chemistry for Bilayer Resist Systems", Journal of Photopolymer Science and Technology, 1998, pp 673–9, vol. 11, No. 4.

Dabbagh et al., "Capabilities and Limitations of Plasma Polymerized Methylsilane (PPMS) All–Dry Lithography", Journal of Photopolymer Science and Technology, 1998, pp 651–61, vol. 11, No. 4.

Karafyllidis et al., "Negative Resist Profiles in 248 nm Photolithography: Experiment, Modelling and Simulation", Semiconductor Science and Technology, 1998, pp 603–10, vol. 13, No. 6.

Robertson et al., "New Patternable Dielectric and Optical Materials for MCM–L/D– and o/e MCM–Packaging", Proceedings. The First IEEE International Symposium on Polymeric Electronics Packaging, 1997, pp 203–12.

Hauouel et al., "Dependence of Developed Negative Resist Profiles on Exposure Energy Dose: Experiment, Modeling, and Simulation", Microelectronics Engineering, 1998, pp 351–4, vol. 41–42.

Suzuki et al., "Proposal of Coplanar–type High–T/sub c/ Superconducting Field–effect Devices", Physica C, 1997, pp 2495–6, vol. 282–287.

Inanami et al., "50 nm Pattern Etching of Si Wafer By Synchrotron Radiation Excited CF/sub 4/plasma", Japanese Journal of Applied Physics, 1997, pp 7706–9, vol. 36, No. 12B.

Yasuzato et al., "Optical Proximity Correction of Alternating Phase–Shift Masks for 0.18 mu m KrF Lithography", Proceedings of the SPIE, 1997, pp 751–62, 3051.

Op De Beeck et al., "NA/sigma Optimization Strategies for an Advanced DUV Stepper Applied to 0.25 mu m and sub–0.25 mu m Critical Levels", 1997, pp 320–32, vol. 3051.

Hulsmann et al., "Edge–Phase–Shifting Lithography for sub 0.3 mu m T–Gates" Proceedings of the SPIE, 1997, pp 295–303, vol. 3051.

Jungchul et al., "Measuring Flare and its Effect on Process Latitude", Proceedings of the SPIE, 1997, pp 708–13, vol. 3051.

Guerin et al., "Simple and Low Cost Fabrication of Embedded Micro–Channels by Using a New Thick–Film Photoplastic", Transducers 97, 1997, pp 1419–22, vol. 2.

La Fontaine et al., "Characterization of SAL605 Negative Resist at Lambada=13nm", OSA Trends in Optics and Photonics, 1996, pp 39–41, vol. 4.

Cha–Won Koh et al., "Characterization of the Resist Pattern Collapse in a Chemically Amplified Resist", Proceedings of the Microlithography Seminar INTERFACE '96, 1996, pp 295–302.

Miller et al., "Getting the Most from I–Line Technology by Optimizing Numerical Aperture and Partial Coherence for Critical Layers", Proceedings of the Microlithography Seminar INTERFACE '96, 1996, pp 269–78.

Katsumata et al., "Chemically Amplified Resist Process for 0.25 mu m Generation Photomasks", Proceedings of the SPIE, 1996, pp 83–91, vol. 2884.

Lee–Soon Park et al., "Effect of Membrane Structure on the Performance of Field–Effect Transistor Potassium–Sensitive Sensor", Sensors and Actuators, 1996, pp 239–43, vol. A57, No. 3.

Katsumata et al., "A Chemically Amplified Resist Process for 0.25 mu m Generation Photomasks", Proceedings of the SPIE, 1996, pp 96–104, vol. 2793.

Wada et al., "New Concept for Negative Tone Electron Beam Resist", Proceedings of SPIE, 1996, pp 70–7, vol. 2793.

Flack et al., "An Investigation of the Properties of Photosensitive Polyimide Films", Proceedings of the SPIE, 1995, pp 169–85, vol. 2726.

Op De Beeck et al., "Optical Proximity Effects and Correction Strategies for Chemical Amplified DUV Resists", Proceedings of the SPIE, 1996, pp 622–33, vol. 2726.

Lin et al., "Water Soluble Resist for "Environmentally Friendly" Lithography", Proceedings of the SPIE, 1996, pp 308–18, vol. 2725.

Nicolau et al., "Application of DNQ–Based Microlithography to Patterning Bioactive Molecules and Cells" Proceedings of the SPIE, 1996, pp 500–11, vol. 2724.

Gabor et al., "Block and Random Copolymer Resists Designed for 193 nm Lithography and Environmentally Friendly Supercritical CO/sub 2/Development", Proceedings of the SPIE, 1996, pp. 410–17, vol. 2724.

Huang et al., "A Negative Tone Resist System Using Vinyl Cyclic Acetal Crosslinker", Proceedings of the SPIE, 1996, pp 315–22, vol. 2724.

Mori et al., "Investigation of Substrate–Effect in Chemically Amplified Resist", Proceedings of the SPIE, 1996, pp 131–8, vol. 2724.

Vinet et al., "Undercut Elimination in DUV Negative Systems: Application to Lithography and Etching of Metal Levels", Proceedings of the SPIE, 1996, pp 82–91, vol. 2724.

Kawahito et al., "Micro–Fluxgate Magnetic Sensing Elements Based on Silicon Microtechnology", Proceedings of the SPIE, 1996, pp 134–7.

Larsen et al., "Design and Fabrication of Compliant Micromechanisms and Structures with Negative Poisson's Ratio", Proceedings IEEE, The Ninth Annual International Workshop on Micro Electro Mechanical Systems, 1996, pp 365–71.

Yan et al., "DUV Wafer Processes", Proceedings of the SPIE, 1995, pp 158–66, vol. 2621.

Suzuki et al., "Focused Ion Beam/Optical–Merged Lithographic Technique Using Ladder Silicone Spin–on Glass", Journal of Vacuum Science & Technology B, 1995, pp 2593–6, vol. 13, No. 6.

Arai et al., "Application of Chemically Amplified Resists on Photomask Fabrication", Proceedings of the SPIE, 1995, pp 74–87, vol. 2512.

Farrar et al., "0.35 Microgram DUV Lithography for Poly Gate Layer", Proceedings of the SPIE, 1994, pp 321–31, vol. 2196.

Pierre et al., "EDMES: an Expert System for Process Optimization in Micro–Lithography", Proceedings of the SPIE, 1994, pp 267–77, vol. 2196.

Op De Beeck et al., "Lithographic Strategies for 0.35 mu m Poly Gates for Random Logic Applications", Proceedings of the SPIE, 1994, pp 407–21, vol. 2195.

Goethals et al., "Proximity Effects in Dry Developed Lithography for Sub–0.35 mu m Application", Proceedings of the SPIE, 1994, pp 395–406, vol. 2195.

Nakano et al., "Transparent Photoacid Generator (ALS) for ArF Excimer Laser Lithography and Chemically Amplified Resist", Proceedings of the SPIE, 1994, pp 194–204, vol. 2195.

Drozdov et al., "Quantum Wires With Controllable Conducting–Channel Width Based on IN/sub 0.53/Ga/sub 0.47/As/InP Heterostructures", Semiconductors, 1994, pp 183–7, vol. 28, No. 2.

Tomo et al., "Process Issue Improvement of Surface Image Transfer Technique: Depth–of–Focus Characteristics and Their Comparison with Simulation Results", Journal of Vacuum Science & Technology B, 1993, pp 2725–32, vol. 11, No. 6.

Ren et al., "Fabrication of Y–Gate, Submicron GaAs Length Metal–Semiconductor Field Effect Transistors", Journal of Vacuum Science & Technology B, 1993, pp 2603–6, vol. 11, No. 6.

Martin et al., "Effects of Focused Ion Beam Reticle Repair on Optical Lithography at I–Line and Deep UltraViolet Wavelengths", Journal of Vacuum Science & Technology B, 1993, pp 427–31.

Leming Shi, "Microarray (Genome Chip)", website–www.GeneChips.com, 2002, 21 pages.

Dietz et al., "The Process of Dry Film Lamination YPCB Manufacture", Printed Circuit Fabrication, 1999, pp 42–5 vol. 22, No. 9.

Waldner, "Registration Concepts for Today's Multilayers YPCB Manufacture", Proceedings of the EPC, 1998, pp1–14.

Hoffman, "Photosensitive Dielectrics for New SBU–Technology YPCB Manufacture", Proceedings of the EPC, 1998, pp 1–10.

Hertlein, "Performance and Limits of Photolithographic Technology: PCB Manufacturing Technology Following Microelectronics Production Technologies", Proceedings of the EPC, 1998, pp 1–7.

Blake, "How Will Direct Imaging Affect AOI? YPCB Manufacture", CircuiTree, 1999, pp 162,4,6 and 8, vol. 12, No. 3.

Gandhi et al., "HDI PCBs. I", Printed Circuit Fabrication, 1999, pp 30, 32, 34, vol. 22, No. 3.

Copeland, "Impedance Control Accuracy YPCB Measurement", Printed Circuit Fabrication, 1999, pp 26–8, 30, vol. 22, No. 2.

Weinhold et al., "PWB Laminations for High–Performance Applications", Electronic Packaging and Production, 1998, pp 77–8, 80–1, vol. 38, No. 10.

Seyfert, "Dimensional Stability Characteristics YPCB Phototools", Printed Circuit Fabrication, 1998, pp 62–3, vol. 21, No. 7.

Halevi et al., "Cost–Effective LDI YPCB Lithography", Printed Circuit Fabrication, 1998, pp 30–1, vol. 21, No. 7.

Rittichier et al., "Laser Direct Imaging: A Strategic Inflection Point YPCB Manufacture", 1998, pp124, 1216, 128, vol. 11, No. 6.

Ben–Ezra, "Meeting the Challenges of Direct Imaging for Cost–Effective Production YPCBs", 1998, pp 108, 110, 112 vol. 11, No. 6.

Atiyam "An Innovative Laser Direct Imaging System YPCB Inner Layers", CircuiTree, 1998, pp 94, 96, 98, vol. 11, No. 6.

Raine, "Tenting: Cost Effective Fabrication of High–Density PWBs for the Year 200 and Beyond", Circuit World, 1998, pp 6–10, vol. 24, No. 3.

Knudsen, "Using a New Photoimageable Dielectric for PWB Sequential Build–Up Technology", Proceedings, The First IEEE International Symposium on Polymeric Electronics Packaging, 1997, pp 33–41.

Heath et al., "Miocrovias Buildup PWBs: Next Generation Substrates", SMTA National Symposium, 1997, pp 1–9.

Brandt et al., "Ground and Power Planes for Impedance–Control and EMI Shielding in PCBs Made from Conductive TLPS Pastes", Proceedings of the Technical Conference, 1997, pp S6/7/1–7.

Harris, "Zero Touch–Up YPCB Photolithography", Proceedings of the Technical Conference, 1997, pp S5/5/1–5.

McGrath, "Multilayer PCB Manufacture Using a Permanent Photoresist—It Can Be Done", Proceedings of the Technical Conference, 1997, pp S5/4/1–5.

Murray, "Laser Imaging Onto Dirtect–Write Film YPCB Manufacture", Proceedings of the Technical Conference, 1997, pp S15/4/1–4.

Morrison, "TEA CO/sub 2/ Laser Micro Via Fabrication In Standard and Emerging PWB Dielectrics", Proceedings of the Technical Conference, 1997, pp S15/3/1–7.

Siddhaye, "Integration of Environmental Factors in Process Modelling for Printed Circuit Board Manufacturing. II. Fabrication", Proceedings of the 1997 IEEE International Symposium on Electronics and the Environment, 1997, pp 226–33.

Linn et al., "An Investigation on Artwork Image Mis–Alignment in Printed Circuit Board Manufacturing", 6th Industrial Engineering Research Conference Proceedings, 1997, pp 696–701.

Hu et al., "Cost Analysis for High Density Printed Wiring Board Manufacturing Processes", IPCWorks '96 Proceedings, 1996, pp 1–5.

Jain et al., "High–Speed, High–Resolution Ylarge–Area PCB Exposure System", Printed Circuit Fabrication, 1997, pp 34, 36, vol. 20, No. 5.

Murray, "Direct Write Film YPCB Phototools", Printed Circuit Fabrication, 1997, pp 24, 26–8, vol. 20, No. 5.

Brautigam et al., "Ultra–High Intensity Imaging YPCB, Technology", Printed Circuit Fabrication, 1997, pp 20–2 vol. 20, No. 5.

Chew et al., "Wastewater Recycling and Copper Recovery at a California PCB Shop", CircuiTree, 1997, pp 132, 134, 136, 138, vol. 10, No. 5.

Ho, "What's Up With SBU Technology? YPCB Sequential Build–Up", Printed Circuit Fabrication, 1997, pp 64, 66, 68, vol. 20, No. 3.

Bergman, "Relieving the Points of Pain YPCB Data Transfer", Printed Circuit Fabrication, 1997, pp 50, 52, 54, vol. 20, No. 3.

Singer et al., "Conventional Versus Build–Up PWB Fabrication: Cost Implications for Electronic Packaging", Proceedings of the 1996 International Electronics Packaging Conference, 1996, pp 443–56.

Ben–Ezra et al., "Direct Imaging Comes of Age YPCB Lithography", CircuiTree, 1997, pp 80, 82, 86, vol. 10, No. 3.

Miller et al., "Zero Wastewater Discharge YPCB Manufacture", Printed Circuit Fabrication, 1996, pp 32, 34–6, vol. 19, No. 11.

Meiler et al., "New Photoelectric for the Sequential Build–Up (SBU) of High–Density Interconnect (HDI) PWB", Proceedings of the Printed Circuit World Convention VII, 1996, pp PO08/1–2.

Lutschounig et al., "Buried Jumper Technology YPCBs", Proceedings of the Printed Circuit World Convention VII, 1996, pp P16/1–11.

Wedeking, "Tooling Data Farm YPCB CAD/CAM", Proceedings of the Printed Circuit World Convention VII, 1996, pp P4/1–5.

Tanizawa, "IBSS (R) Based PCB Technology for High Pin Count/Fine Pitch Package Assembly", Proceedings of the Printed Circuit World Convention VII, 1996, pp P21/1–6.

Ohta, "Development of DVH–ADD Printed Wiring Board for High Density MCM", Proceedings of the Printed Circuit World Convention VII, 1996, pp P21/1–6.

McGregor, "Effects of Copper Foil Type and Surface Preparation on Fine Line Image Transfer in Primary Imaging of Printed Wiring Boards", Proceedings of the Printed Circuit World Convention VII, 1996, pp 17/1–20.

Vaughan et al., "Advances in Environmentally Conscious Manufacturing Through the Use of Permanent Photoimagable Materials in PWB Fabrication", Proceedings of the Printed Circuit World Convention VII, 1996, pp S19/3/1–5.

Conrod et al., "PhotoDefinable Dielectric Materials for High Density Printed Wiring Board Applications", Proceedings of the Technical Conference IPC Printed Circuits EXPO, 1996, pp S8/5/1–6.

Nakahara et al., "Review of the Current Status of Laser Direct Imaging YPCB Manufacture", Proceedings of the Technical Conference IPC Printed Circuits EXPO, 1996, pp S8/1/1–3.

Aday et al., "A Comparative Analysis of High Density PWB Technologies", Proceedings of the SPIE 1996, pp 239–44, vol. 2794.

Holden, "Comparing Costs for Various PWB Build–Up Technologies YMCM–L", 1996, pp 15–21, vol. 2794.

Eickmans, "Mastertool: A New Dry Phototool in the Production of Printed Circuit Boards", Circuit World, 1996, pp 26–32, vol. 22, No. 3.

Crum, "Imaging Technology: Today, Tomorrow and Beyond YPCB Manufacture", Electronic Packaging and Production, 1996, vol. 36, No. 3.

Layden, "Is Photoplotting Finally Seeing the Light? II. YPCB Design", Printed Circuit Designs, 1995, pp 27–8, vol. 12, No. 12.

Ohlig, "Lighting Equipment and Fine–Line Production YPCB Lithography", Printed Circuit Fabrication, 1996, pp 32–3, vol. 19, No. 1.

Frauzem, "Increasing Productivity YPCB Lithography", Printed Circuit Fabrication, 1996, pp 26–8, vol. 19, No. 1.

Nakamura et al., "High Reliability, High Density Build Up Printed Circuit Board for MCM–L", Proceedings 1995 International Conference on Multichip Modules (SPIE), 1995, pp 36–41, vol. 2575.

Layden, "Is Photoplotting Finally Seeing the Light? I. YPCB Design", Printed Circuit Design, 1995, pp 16–17.

Yoshiki et al., "Pattern Formation of Cu Layer By Photocatalytic Reaction of ZnO Thin Film Y Printed Circuit Boards", Journal of the Electrochemical Society, 1995, pp L235–7, vol. 142, No. 12.

Dietz, "Fine Line Imaging (PCB Photolithography)", Printed Circuit Fabrication, 1995, pp 32, 34, 36, vol. 18, No. 10.

Bridges, "Fine–Line Imaging, (PCB Manufacturing)", Printed Circuit Fabrication, 1995, pp 34, 36–8, vol. 18, No. 7.

Schillhammer, "Rapid Multi–Layer PCB Phototyping in an Engineering Lab Environment", Proceedings of the Technical Program. National Electronic Packaging and Production Conference, 1994, pp 49–52.

Soules, "Dissecting Film Defects (PCB Manufacture, Imaging Contamination)", Printed Circuit Fabrication, 1994, pp 26, 28, vol. 17, No. 12.

Layton, "Gerber Basics: A PCB Primer—What is the Gerber Format, and Why Do I Need It?", Printed Circuit Fabrication, 1994, pp 30–2, vol. 16, No. 7.

Bowls et al., "Illuminating Imaging (PCB)", Printed Circuit Fabrication, 1993, pp 40–1, vol. 16, No. 5.

Timmons, "Imaging Large High Performance Printed Wiring Boards", Surface Mount International Conference and Exposition, Proceedings of the Technical Program, 1992, pp 543–6, vol. 1.

Kimura et al., "Mass–Production of PWBs With 5 Track Technology", NEC Technical Journal, 1993, pp 77–81, vol. 45, No. 9.

Shawhan et al., "Plated Copper Ceramic PWBs: a Versatile Metallization Technology", Hybrid Circuit Technology, 1992, pp 28–33, vol. 8, No. 12.

Venkata, "Industrial Fabrication of Printed Circuit Boards", Electrical India, 1990, pp 13–1, vol. 30, No. 23.

Rust, "Plasma cleaning of lands to improve bonding of surface mount components to printed wiring boards", IEPS, Proceedings of the Technical Conference, 1990, pp95–109.

Lozano, "Phototools are Developing the Future of PCBs", Electronic Packaging and Production, 1990, pp 42–4, vol. 30, No. 12.

No–Author, "The Production of PCBs Using Pre–Sensitized Base Material", Revista Espanola De Electronica, 1990, pp 36–8, No. 427.

Weinhold, "Solder–Stopping Masks for Printed Circuit Boards", Electronik Praxis, 1990, pp 30–33, vol. 25, No. 15.

Berry, A Fabricator's Experience with a Curtain Coatabe PILSM with SMT type PWBs, 1990, pp 731–8, vol. 1.

Pavese et al., "The Three Dimensions made in Italy (PCBs)", Elettronica Oggi, 1990, pp 160–72, No. 90.

Moughin et al., "Magnetic Micropatterning of FeNi/FeMn Exchange Bias Bilayers By Ion Irradiation", Journal of Applied Physics, 2001, pp 6606–8, vol. 89, No. 11.

Guo et al., "Use of MicroFabricated Cold Field Emitters in Sub–100 nm Maskless Lithography", Journal of Vacuum Science & Technology, 2001, pp 862–5, vol. 19, No. 3.

Menon et al., "Zone–Plate–Array Lithography (ZPAL): Simulations for System Design", AIP Conference Proceedings, 2000, pp 647–52, No. 507.

Ishibashi et al., "Combining Atomic Force Microscopic Lithography with Photolithography", Japanese Journal of Applied Physics, 2000, pp 7060, vol. 39, No. 12B.

Parker et al., "A High Throughput NGL Electron Beam Direct–Write Lithography System", Proceedings of the SPIE, 2000, pp 713–20, vol. 3997.

Dai et al., "Lossless Layout Compression For Maskless Lithography System", Proceedings of SPIE, 2000, pp 467–77, vol. 3997.

Luo Xian–Gang, "Nanolithography Technology", Wuli, 2000, pp 358–63, 350, vol. 29, No. 6.

Parker et al., "A High Throughput Electron–Beam Direct–Write Lithography System", Microlithography World, 2000, pp 22, 24–5, 30, vol. 9, No. 3.

Lakner et al., "Micromirrors For Direct Writing Systems and Scanners", Proceedings of the SPIE, 1999, pp 217–27, vol. 3878.

Higgins et al., "Anisotropic Spinodal Dewetting as a Route to Self–Assembly of Patterned Surfaces", Nature, 2000, pp 476–8, vol. 404, No. 6777.

Polesello et al., "Micromachining of Silicon With a Proton Microbeam", Nuclear Instruments & Methods in Physics Research, 1999, pp 173–8, vol. 158, No. 1–4.

Carter et al., "Maskless, Parallel Paterning With Zone–Plate Array Lithography", Journal of Vacuum Science & Technology, 1999, pp 3449–52, vol. 17, No. 6.

Carter et al., "Zone–Plate Array Lithography (ZPAL): A New Maskless Approach", Proceedings of the SPIE, 1999, pp 324–32, vol. 3676.

Watjen et al., "On the Interpretation of Micro–PIXE Measurements on a Prototype Microstructured Reference Material", Nuclear Instruments & Methods in Physics Research, 1999, pp 532–7, No. 1–4.

Pueker et al., "High Resolution Phase Zone Plates for Wafer Window Wavelengths", Proceedings of the SPIE, 1998, pp 118–28, vol. 3449.

Groves et al., "Distributed Multiple Variable Shaped Electron Beam Column fr High Throughput Maskless Lithography", Journal of Vacuum Sciences, 1998, pp 3168–73, vol. 16, No. 6.

Fuller et al., "Photomask Edge Roughness Characterization Using an Atomic Force Microscope", Proceedings of the SPIE, 1998, pp 433–40, vol. 3332.

Descour et al., "Mass–Producible Microtags for Security Applications: Calculated Fabrication Tolerances By Rigorous Coupled–Wave Analysis", Optical Engineering, 1998, pp 1254–61, vol. 37, No. 4.

Avramescu et al., "Atomic Force Microscope Lithography on Carbonaceous Films Deposited by Electron–Beam Irradiation", Applied Physics Letters, 1998, pp 716–18, vol. 72, No. 6.

Trau et al., "Microscopic Patterning of Orientated Mesoschopic Silia Through Guided Growth", Nature, 1997, pp 674–6, vol. 390, No. 6661.

Descour et al., "Mass–Producible Microtags for Security Applications: Tolerance Analysis by Rigorous Coupled–Wave Analysis", Proceedings of the SPIE, 1997, pp 15–24, vol. 3009.

Graham et al., "Conducting Polyaniline Coatings For Submicron Lithography and SEM Technology", Proceedings of the SPIE, 1997, pp 105–13, vol. 3048.

Sweatt et al., "Mass–Producible Microtags", OSA Trends in Optics and Photonics, 1996, pp 212–14, vol. 4.

Matsuo et al., "Investigations on Reaction Mechanisms in a Surface Modification Resist Process Using Chemical Vapor Deposition of Polysiloxane", Journal of Electrochemical Society, 1997, pp 2903–9, vol. 144, No. 8.

No–Author, "Atom Optics", Proceedings of the SPIE, 1997, vol. 2995.

Biebuyck et al., "Lithography Beyond Light: Microcontact Printing with Monolayer Resists", IBM Journal of Research and Development, 1997, pp 159–70, vol. 41, No. 1–2.

Terris et al., "Nanoscale Replication for Scanning Probe Data Storage", Applied Physics Letters, 1996, pp 4762–4, vol. 69, No. 27.

Descour et al., "Mass–Producible Microscopic Computer–Generated Holograms: Microtags", Optics Letters, 1996, pp 1951–3, vol. 21, No. 23.

Ishikawa et al., "Nanometer–Scale Pattern Formation of GaAs by in Situ Electron–Beam Lithography Using Surface Oxide Layer as a Resist Film", Journal of Vacuum Science, 1995, pp 2777–80, vol. 13, No. 6.

Dz–Chi et al., "Computer Simulations For Mask Structure Heating in X–Ray Lithography", Computers and Structures, 1996, pp 825–34, vol. 58, No. 4.

Takechi et al., "Effects of Electron Beam Irradiation on Highly Oriented Poly (di–methyl silane) Film", Journal of Physics D, 1995, pp 535–8, vol. 28, Mo. 3.

Ruokamo et al., "H/sub 2/S Response of WO/sub 3/ Thin–Film Sensors Manufactured by Silicon Processing Technology", Sensors and Actuators B (Chemical), 1994, pp 486–8, vol. B19, No. 1–3.

Trippe et al., "Synchotron Beamless For X–Ray Lithography", Proceedings of the SPIE, pp 314–19, vol. 2045.

Scheckler et al., "Simulation of AZ–PN100 Resist Pattern Fluctuation in X–Ray Lithography, Including Synchotron Beam Polarization", Japanese Journal of Applied Physics, 1993, pp 5951–9, vol. 32, No. 12B.

Schmidt et al., "Wafer Process–Induced Distortion Study for X–Ray Technology", Journal of Vacuum Science, 1991, pp 3237–40, vol. 9, No. 6.

Wilkinson, "Dry Etch Damage and Its Effect on Electronic and Optical Nanostructures", Superlattices and Microstructures, 1990, pp 381–6, vol. 7, No. 4.

Mescheder, "Investigation of Linewidth Uniformity in X–Ray Lithography", 1989, pp 396–40, vol. 1087.

Shiokawa, "Microfabrication Technologies by Focused Ion Beam", 1989, pp 274–8, vol. 55, No. 2.

Shimazu et al., "High Speed Electron Beam Lithography", Journal of the Japan Society of Precision Engineering, 1987, pp 1682–6, vol. 53, No. 11.

Cullman, "Automatic Alignment System", Voltage des 50. PTB Seminars Mikrometrologie Seminar, 1983, pp 287–92.

MASKLESS PHOTOLITHOGRAPHY USING PLASMA DISPLAYS

CROSS-REFERENCE TO A RELATED APPLICATION

This application claims the benefit of U.S. Provisional Application No. 60/301,218, filed Jun. 27, 2001, and incorporated herein by reference.

TECHNICAL FIELD

The present invention relates to photolithography systems and methods, specifically, to maskless photolithography devices and methods for creating 2-D and 3-D patterns using a plasma display.

BACKGROUND ART

Photolithography systems are known in the art that direct light beams onto a photosensitive surface covered by a mask, etching a desired pattern on the substrate corresponding to the void areas of the mask. Maskless photolithography systems are also known in the art as described in Singh-Gasson, Sangeet et al., Nature Biotechnology 17, 974–78, 1999. The system described in that article uses an off-axis light source coupled with a digital mirror device to fabricate DNA chips containing probes for genes or other solid phase combinatorial chemistry to be performed in high-density microarrays.

A number of patents also exist which relate to maskless photolithography systems, including U.S. Pat. Nos. 5,870,176; 6,060,224; 6,177,980; and 6,251,550; all of which are incorporated herein by reference.

Plasma displays, as known in the art, generally consist of two glass plates, each containing a network of parallel electrodes and intersecting address electrodes, sealed to form a discharge envelope filled with a neon and xenon gas mixture. A gas discharge plasma is created by applying an electric field between the electrodes. The plasma generates ultraviolet light, which in turn excites a phosphor coating inside the glass envelope to generate a pixel of light.

A number of patents directed to plasma display devices exist, including U.S. Pat. Nos. 6,376,986, 6,362,799, 6,344,715, and 5,661,500; all of which are incorporated herein by reference.

While the previously described maskless photolithography systems address several of the problems associated with mask based photolithography systems, such as distortion and uniformity of images, problems still arise. Notably, maskless photolithography systems are complex and require complex optical systems and micromirror arrays.

Typically, maskless photolithography systems require two sets of complex optics: one set of optics to condition light emanating from a light source and directed to a spatial light modulator and a second set of optics to further conditions and direct the light reflected from the spatial light modulator. Consequently, two sets of complex optics and a light source must be mechanically aligned and maintained for a maskless system. For the digital mirror device, digital shifting of a mask pattern has been proposed to resolve micromirror to object alignment, this technique cannot be used to align the light source in relation to the micromirror array.

In addition, the use of micromirror arrays in maskless photolithography systems poses other problems. Micromirror arrays are specialized, custom devices that require complex driving circuitry and are subject to a phenomenon known as "stiction." Stiction occurs when the individual mirrors in a micromirror array "stick" in a specific orientation if left in that position for an extended period. Consequently, a higher voltage needs to be applied to the mirror drive to point the mirror in another desired direction. Thus, the micromirror array consumes more power than normal and the reliability of the mirror can be affected.

Accordingly, there is a need in the art for a method and system for maskless photolithography to eliminate unnecessary complexity and provide a direct radiation means to provide a more effective way to fabricate custom devices. This system needs to eliminate redundant optical fixtures required by micromirror array based maskless photolithography systems that rely on reflection of light generated by a separated light source. The system needs to provide a single device for generating patterned light and directing the patterned light to an object, thereby eliminating the need for a separate light source and associated optics. In addition, the system needs to combine ease of use, reconfigurability, and the ability to provide coarse manual alignment and automated fine alignment of mask patterns. In summary, the system needs to combine all the advantages of a maskless photolithography system with the advantages of pixel addressable, UV emitting plasma display to eliminate complexity and provide a simpler, more cost effective maskless photography system.

SUMMARY OF THE INVENTION

In view of the foregoing deficiencies of the prior art, it is an object of the present invention to provide a maskless photolithography system using a plasma display for creating patterns on objects.

It is another object of the present invention to provide a method of maskless photolithography that uses a plasma display device to generate and direct patterned light on an object.

It is still another object of the present invention to provide a plasma device display that lacks phosphor coatings, whereby the plasma device generates ultraviolet (UV) light directly.

It is still another object of the present invention to provide a positioning fixture; selectively movable in a three dimensions to accurately position a substrate for maskless photolithography using a plasma device as a source of patterned light.

It is another object of the present invention to provide plasma based, maskless photolithography system for creating micro and macro three-dimensional structures.

To achieve these objects, a system and method are provided to create two dimensional and three dimensional structures using a maskless photolithography system that is directly reconfigurable and does not require masks, templates or stencils to create each of the planes or layers on a multi layer two-dimensional or three dimensional structure. In an embodiment, the invention uses a plasma display device comprising ultraviolet (UV) light emitting pixels to illuminate a substrate that has photoreactive compounds applied to the exposed surface. The plasma display comprises an array of miniature plasma discharge cells, or pixels, that combine light generation and modulation to create individually addressable UV light pixels. Each element of an array of UV light pixels in a plasma display is activated by a network of electrodes and can be selectively turned on and off to create a desired two-dimensional light pattern. The emitted light beam, comprising light from each individual UV light pixel, can be directed towards a target substrate coated with a photoreactive compound. The UV light reacts with the photoreactive compound to create a pattern on the substrate corresponding to the illumination pattern.

The desired pattern is designed and stored using conventional computer aided drawing techniques and is used to control the "firing" of the individual pixels of the plasma display to create the corresponding desired mask pattern.

In addition, an alignment fixture, movable in three dimensions, for mounting of the substrate is provided. The alignment fixture allows the affixed substrate to be moved in three dimensions, providing alignment in two, coplanar dimensions and a third dimension perpendicular to the two coplanar dimensions. By providing alignment in the third dimensional direction, the invention advantageously provides the capability to produce three-dimensional structures on a substrate.

The advantages of the invention are numerous. One significant advantage is that the tasks of light generation and patterning in a maskless photolithography system can be combined into a single plasma display device. Thus, need for a separate light source and optics stage as in conventional micromirror array-based systems is eliminated, resulting in a simpler, more cost efficient system. Another advantage is that a plasma display device is inherently more reliable than a micromirror device. Yet another advantage is that plasma devices are readily available as off-the-shelf devices, complete with readily adaptable control electronics.

Still another advantage is the ability to use the invention as a reconfigurable, rapid prototyping tool for creating two-dimensional and three-dimensional micro and macroscopic objects. Yet another advantage of the invention is that it provides the ability to reduce prototyping costs and enable devices to be fabricated more quickly with less risk. Still another advantage of the current invention is a reduction in cost for prototyping activities realized by the elimination of physical masks. Yet another advantage of the current invention is that pattern generation can be performed optically without having to use expensive vacuum system required by conventional mask-based photolithography. A particular advantage of the current invention is the ability to create three-dimensional devices using an alignment stage to selectively expose successive layers in a substrate.

As a result, any arbitrary micro or macroscopic structure can easily and quickly be created in substrates such as polymers, metals, or ceramics. Patterns such as microfluidic networks, thin film devices, hybrid material devices, micro electromechanical machines (MEMs), and combinations of the above mentioned devices can be created using the reconfigurable, application specific photolithography system disclosed. In addition, because plasma arrays are available in large formats, large-scale objects can be patterned in one exposure, obviating the need to sequentially expose smaller areas until the entire surface is exposed.

All patents, patent applications, provisional applications, and publications referred to or cited herein, or from which a claim for benefit of priority has been made, are incorporated herein by reference in their entirety to the extent they are not inconsistent with the explicit teachings of this specification.

Other aspects and advantages of the invention will become apparent from the following detailed description taken in conjunction with the accompanying drawings, illustrating, by way of example, the principles of the invention.

BRIEF DESCRIPTION OF THE DRAWINGS

In order that the manner in which the above recited and other advantages and objects of the invention are obtained, a more particular description of the invention briefly described above will be rendered by reference to specific embodiments thereof, which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

Figure 1:
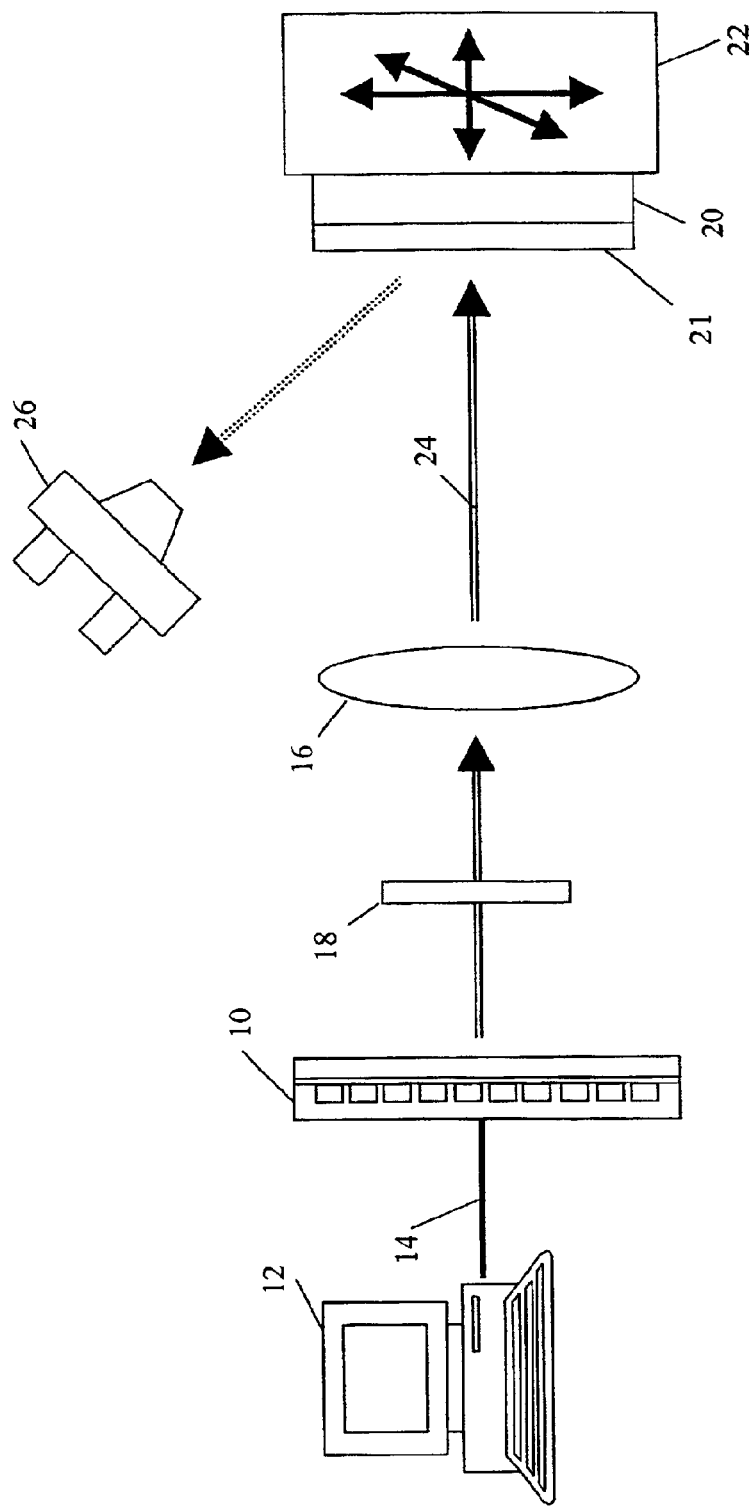
FIG. 1 illustrates a maskless photolithography system using a plasma display device.

It should be understood that in certain situations for reasons of computational efficiency or ease of maintenance, the ordering and relationships of the blocks of the illustrated flow charts could be rearranged or re-associated by one skilled in the art. While the present invention will be described with reference to the details of the embodiments of the invention shown in the drawings, these details are not intended to limit the scope of the invention.

DETAILED DESCRIPTION OF THE INVENTION

Reference will now be made in detail to the embodiments consistent with the invention, examples of which are illustrated in the accompanying drawings. First, briefly, the invention is a system and method to create two dimensional and three dimensional structures using a maskless photolithography system that is directly reconfigurable and does not require masks, templates or stencils to create each of the planes or layers on a multi layer two-dimensional or three dimensional structure. In an embodiment, the invention uses a plasma display device comprising ultraviolet (UV) light emitting pixels to illuminate a substrate that has photoreactive compounds applied to the exposed surface. The plasma display comprises an array of miniature plasma discharge cells, or pixels, that combine light generation and modulation to create individually addressable UV light pixels. Each element of an array of UV light pixels in a plasma display is activated by a network of electrodes and can be selectively turned on and off to create a desired two-dimensional light pattern. The emitted light beam, comprising light from each individual UV light pixel, can be directed towards a target substrate coated with a photoreactive compound. The UV light reacts with photoreactive compound to create a pattern on the substrate corresponding to the illumination pattern. In addition, an alignment fixture for mounting of the substrate allows the substrate to be moved in three dimensions, providing alignment in two, coplanar dimensions and the capability to produce three dimensional structures by aligning the substrate in a third dimension perpendicular to the two coplanar dimensions.

I. Maskless Photolithography System

Referring now to FIG. 1, an embodiment of the current invention includes a plasma display device 10, a computer system 12, a lens system 16, a substrate 20, mounted on a movable alignment fixture 22, and an optical viewer 26. A layer of photoreactive chemicals 21 is disposed on the substrate 20.

As shown, plasma display device 10 generates a beam of light, or patterned light beam 26, wherein each pixel of the plasma display corresponds to a pixel of the mask pattern.

Plasma display device 10 is controlled by computer system 16 over signal line(s) 14 to generate light according to a desired mask pattern stored in memory. In addition, computer system 12 can shift the desired mask pattern in two dimensions to align the pattern with the substrate 20 mounted on movable alignment fixture 22. Precise pattern alignments are made electronically by shifting the mask pattern information provided to the plasma display device 10 such that the image directed to the substrate is translated to correct for misalignment. For example, if the mask pattern needs to be shifted to the right one pixel width to be properly aligned on the substrate, the computer compensates for the misalignment by shifting the mask pattern one pixel width to the right.

The patterned light beam radiated from plasma display device 10 can be selectively filtered by inserting or removing filter 18 from patterned light beam 24. Filtering can take place at any point along the light beam path to prevent exposure during alignment. A lens system 16 can collimate and condition the light beam as desired. After passing through lens system 16, patterned light beam 24 impinges on a layer of photoreactive chemicals 21 applied to substrate 20, thereby creating a pattern on substrate 20 by producing a reaction between the layer of photoreactive chemicals 21 and substrate 20. Alternatively, a photoresist chemical could be applied to substrate 20 to etch areas of substrate 20 not masked off by the mask pattern during an exposure.

The mask pattern described above is a programmable mask pattern generated with the use of computer aided design and is resident on computer system 12. Accordingly, the mask pattern to be transferred to the layer of photoreactive chemicals 21 and substrate 20 is a selectively programmable mask pattern. Thus, with a programmable mask pattern, any portion of the pattern on the substrate 20 can be manipulated and/or changed as desired for rendering of desired changes as maybe needed, furthermore, on a significantly reduced cycle time.

Advantageously, the present system optionally allows an image to be shifted electronically to provide fine alignment of the pattern on substrate 20. The mask pattern is digitally shifted according to alignment information in one or more directions for achieving a desired mask alignment on substrate 20. Adjustments in alignment are carried out electronically in the mask bit pattern information provided to the pixel array. As a result, fine adjustments in pattern alignment can thus be easily accomplished.

Movable alignment fixture 22, in conjunction with optical viewer 26, provides the capability to initially align substrate 20 under patterned light beam 24 using mechanical alignment mechanisms (not shown) to align substrate 20 in three dimensions. The mechanical alignment system may include gears, pulleys, belts, chains, rods, screws, hydraulics, pneumatics, piezo movements, or combinations thereof as known in the art to support and move an object in three dimensions. While performing alignment procedures, filter 11 is inserted in patterned light beam 24 to filter out the wavelengths of light that react with the layer of photoreactive chemicals 21 on substrate 20. Optical viewer 26, provides a means to monitor the positioning of substrate during manual alignment. While providing alignment in coplanar first and second dimensions, alignment fixture 22 advantageously provides alignment in a direction perpendicular to the coplanar first and second dimensions, allowing fabrication of three-dimensional objects. For example, to gain more control over sidewall profiles or to produce complicated structures, multiple layers of substrate 20 can be sequentially exposed by aligning substrate 20 in the third dimension to create three-dimensional features. Coupled with optional computer controlled alignment of the desired pattern, the invention provides the capability to quickly manually align substrate 20 under patterned light beam 24 and allows computer system 16 to automatically finely tune the alignment before exposing layer of photoreactive chemicals 21 on substrate 20.

II. Plasma Display

Figure 2:
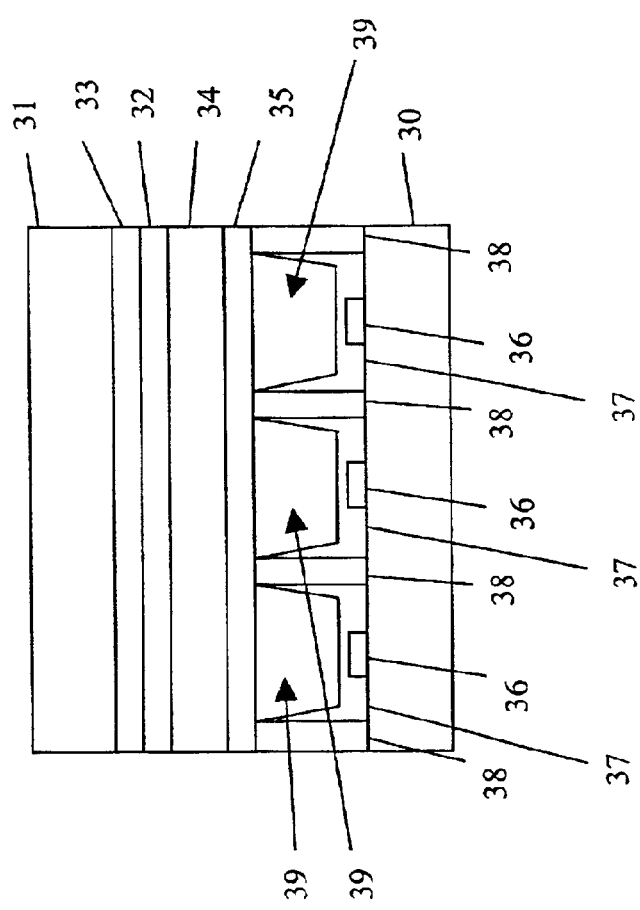
FIG. 2 illustrates a cross sectional view of a plasma display device.
Figure 3:
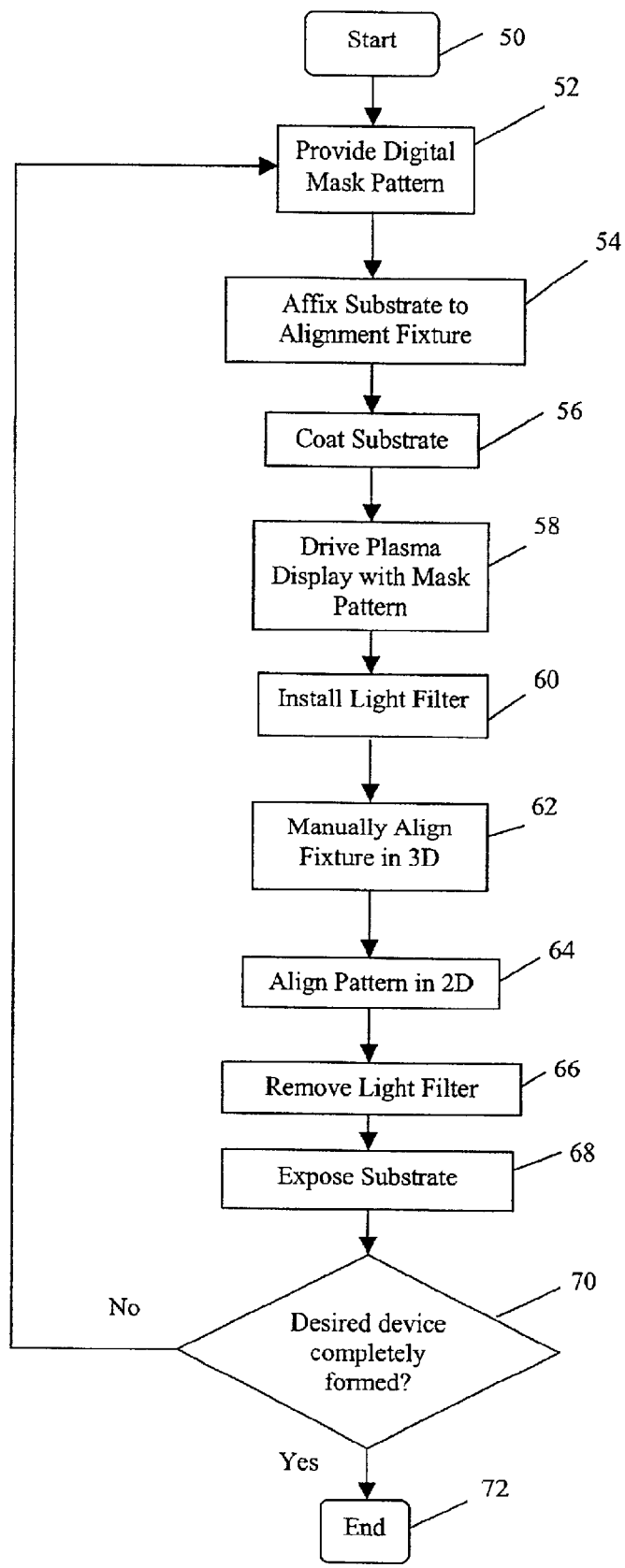
FIG. 3 is a flow chart illustrating a maskless photolithography method according to an embodiment of the present invention.

The plasma display 10 of FIG. 1 will now be described in more detail with reference to FIG. 2. FIG. 2 illustrates the structure of a conventional AC memory-type plasma display panel in cross section, as is known in the art. As illustrated, this type of plasma display panel has a front substrate 31 and a rear substrate 30 which face each other and which are made of insulating material such as glass. A plurality of transparent surface discharge electrodes 32, formed from an ITO (Indium Tin Oxide) or Nesa film, are provided on the front substrate 31. In order to reduce the resistances of the surface discharge electrodes 32, trace electrodes 33 are formed on each surface discharge electrodes 32. Normally, Cr/Cu/Cr (chrome/copper/chrome) stacked thin film electrodes or Ag (silver) thick film electrodes are use as the trace electrodes 33.

A dielectric layer 34 is formed on the surface discharge electrodes 32 and the trace electrodes 33. In general, lead glass having a low melting point is used to form the dielectric layer 34. A magnesium oxide (MgO) film 35, having a thickness of approximately 0.5 micrometer (um) to 1.0 um is formed on the dielectric layer 34 by vacuum vapor deposition. The MgO film prevents damage to the dielectric layer 34 from ions generated by the plasma and allows the plasma display to operate at lower voltages. A plurality of data electrodes 36, which face the surface discharge electrodes 32 and which are substantially perpendicular to the surface discharge electrodes 32, are formed on the rear substrate 30. Silver (Ag) thick film electrodes are employed as the data electrodes 36. In addition partitions 38, extending upwardly from the rear substrate 30 are provided to separate each data electrode 36 and define a discharge space 39. The discharge space 39 is filled with a two-component gas, such as neon and xenon.

A white dielectric layer 37 is formed over the data electrodes 36, the rear substrate 30, and the sides of the partitions 38. The white dielectric layer 37 is formed by printing and sintering glass paste prepared by mixing a powder of white oxide (alumna, titanium oxide, or the like), and a powder of lead glass having a low melting point. The white dielectric layer 37 has the function of reflecting light and directing the light toward the front substrate 41.

Typically, phosphor layers (not shown) are formed on the white dielectric layer 37 to provide visible light. The phosphor layers are separate coatings of three phosphor materials applied onto the white dielectric layer 37 by thick film printing techniques. When excited by ultraviolet (UV) light, the phosphors emit red, green and blue visible light according the their respective radiation characteristic.

Plasma displays 37 generate light by applying a voltage to the surface discharge electrodes 32 at the position indicated by a corresponding data electrode 36. The surface electrodes 32 and data electrodes 36 are oriented at right angles to each other, forming a grid that provides the capability to create a plasma pixel of light at the intersections of the surface electrodes 32 and the data electrodes 36. When the voltage reaches a "firing level," a plasma discharge occurs on the surface of the dielectric layer 34, at the intersection of the surface electrode 32 and the addressed data electrode 36, resulting in the emission of UV light. In turn, the UV light excites the phosphor coating causing the phosphors to emit visible light. The intensity of the UV light, and the resulting light emitted by the phosphors is controlled by varying the number and width of voltage pulses to the surface discharge electrodes 32.

For conventional applications, such as television monitors, plasma displays are specifically designed to emit visible light. However, according to the current invention, the UV light produced by a plasma device is used directly to expose substrates in maskless lithography systems. By eliminating the phosphor coating normally used in plasma displays, a display can be designed to emit only UV radiation, which is then used to expose a substrate having UV photoreactive compounds applied.

III. Method for Maskless Photolithography

A method of using the current invention to create patterned objects will now be described. It should be understood that in certain situations for reasons of computational efficiency or ease of maintenance, the ordering and relationships of the blocks of the illustrated flow charts could be rearranged or re-associated by one skilled in the art. Starting from step 50, a desired mask pattern is designed and stored on computer system 12 in step 52. Alternatively, mask pattern designs can be designed on other computer systems and imported into computer system 12. Next, in step 54, a substrate 20 is placed on alignment fixture 22 and coated with a layer of photoreactive chemicals 21 in step 56. Once the substrate is mounted in alignment fixture 22, computer system 12 can be instructed to provide the resident mask pattern information to plasma display device 10 as shown in step 58, and the plasma display device 10 responds by applying a firing voltage to each individual pixel to direct a patterned light beam 24 towards the substrate 20 according to the desired pattern. Next, alignment of the substrate is performed by placing filter 18 in patterned light beam 24 path according to step 60 and projecting patterned light beam 24 through lens system 16, and onto layer of photoreactive chemicals 21 and substrate 20.

With the desired pattern projected on substrate 20, alignment fixture 22 can be manually aligned in three dimensions according to step 62 by moving alignment fixture 22 to ensure that substrate 20 is properly located in patterned light beam 24. Proper alignment is verified by viewing the projected pattern on substrate 20 through optical viewer 26. Once substrate 20 is manually aligned, alignment information is optionally provided to computer system 12 and computer system 12 automatically adjusts the plasma display device 10 by shifting the pattern in two dimensions to attain proper alignment in optional step 64. Having aligned substrate 20, the layer of photoreactive chemicals 21 on substrate 20 is exposed in step 68 by removing filter 18 from patterned light beam 24 in step 66 and allowing the light to cause a reaction between layer of photoreactive chemicals 21 and substrate 20 for a required reaction time depending on the photoreactive chemicals used. For example, using standard Novolac™ positive photoresist, an exposure time of 60 seconds is used.

If further exposures are desired in step 70, such as required when creating three-dimensional objects, the above method is repeated by returning to step 52 until the desired object is fabricated. A new digital mask pattern is provided, another photoreactive coat is applied, and the substrate is realigned and re-exposed. Once the desired object has been created, the process ends in step 72.

IV Exemplary Embodiment

An example of the current invention using the system and method described above will now be presented. In an embodiment, the current invention is designed to be an integrated, reconfigurable, rapid prototyping maskless photography system. The system provides a computer, optics, a plasma display device, and integrated electronic components used to directly generate patterns for the exposure of photoresist and other photoimagable materials. This pattern is then transferred to the substrate surface and used to expose the photo-sensitive material required in the user's fabrication process.

A personal computer, operably connected to a plasma display device, is used to provide mask patterns. The mask patterns are generated in the computer and then transferred to the plasma display to provide the optical pattern for exposure. The pattern is illuminated on a substrate and is observed using an optical microscope. The microscope is then used to monitor alignment of the pattern on the substrate. Alignment is controlled through the use of a course alignment stage provided by a mechanically movable substrate mounting alignment fixture, combined with a fine, electronic alignment stage. This fine alignment stage is computer controlled and aligns the mask pattern radiated from the plasma display instead of moving the alignment fixture, thereby offering exceptional accuracy and repeatability. Once alignment is complete, the substrate can be exposed. Multiple layers can be created using an alignment stage movable in a direction parallel to the light beam.

In addition, according to the invention, three-dimensional patterns can be created using the three-dimensional alignment capabilities disclosed above. For example, patterning using thick photo resist or multiple layer patterning of individual photoresist layers. These techniques can be use to provide either a photomask for subsequent etching of substrate materials, or, if the photopolymer is compatible with the chemistry used in the device, the fabricated features can be used as part of the device itself.

Furthermore, many other variations are possible using the present inventive system and method. For example, the invention can be used for rapidly creating micro electro-mechanical (MEMs) devices, creating artificial receptors chips, creating integrated circuit patterns of conducting polymers, photo-induced etching of semiconductor material, creating patterns in photosensitve or photo-chromic glass, photoselective deposition of metal onto a substrate, creating integrated microsensor arrays and fluid delivery networks, chemical vapor deposition, thin film fabrication, gray scale photolithography, large area pattern expression, and creating molecular based detection devices.

Based on the foregoing specification, the computer system of the disclosed invention may be implemented using computer programming or engineering techniques including computer software, firmware, hardware or any combination or subset thereof. Any such resulting program, having computer-readable code means, may be embodied or provided within one or more computer-readable media, thereby making a computer program product, i.e., an article of manufacture, according to the invention. The computer readable media may be, for instance, a fixed (hard) drive, diskette, optical disk, magnetic tape, semiconductor memory such as read-only memory (ROM), etc., or any transmitting/receiving medium such as the Internet or other communication network or link. The article of manufacture containing the computer code may be made and/or used by executing the code directly from one medium, by copying the code from one medium to another medium, or by transmitting the code over a network.

One skilled in the art of computer science will easily be able to combine the software created as described with appropriate general purpose or special purpose computer hardware to create a computer system or computer subsystem embodying the method of the invention. An apparatus for making, using or selling the invention may be one or more processing systems including, but not limited to, a central processing unit (CPU), memory, storage devices, communication links and devices, servers, I/O devices, or any sub-components of one or more processing systems, including software, firmware, hardware or any combination or subset thereof, which embody the invention. User input may be received from the keyboard, mouse, pen, voice, touch screen, or any other means by which a human can input data into a computer, including through other programs such as application programs.

It should be understood that the examples and embodiments described herein are for illustrative purposes only and that various modifications or changes in light thereof will be suggested to persons skilled in the art and are to be included within the spirit and purview of the claims application.

What is claimed is:

1. A system for maskless photolithography comprising:
    a. a computer system for generating mask patterns; and
    b. a plasma display, having individually addressable pixels, operably connected to and controllable by said computer system, wherein said display generates a patterned light beam corresponding to said mask patterns provided by said computer system to expose an object to said patterned light beam and to create patterns on the object corresponding to said mask patterns.

2. The system of claim 1, wherein said plasma display radiates ultraviolet light (UV) and does not have phosphor coatings for converting ultraviolet light (UV) to visible light.

3. The system of claim 1, further comprising an optical system for collimating said patterned light beam emitted from said plasma display and directing said patterned light beam onto an object.

4. The system of claim 1, further comprising a manually controlled alignment fixture for mounting the object, wherein said alignment fixture is movable in coplanar first and second dimensions, and in a third dimension direction substantially perpendicular to said first and second coplanar dimensions and substantially parallel to said patterned light beam; said fixture providing three dimensional alignment of the object beneath said patterned light beam, wherein said alignment fixture is moved in three dimensions in response to mechanical alignments directly provided by a user.

5. The system of claim 1, further comprising a computer controlled pattern alignment system, for receiving alignment information and for providing electrical alignment of said patterns in coplanar first and second dimensions, wherein said pattern alignment system adjusts the alignment of said mask patterns in coplanar first and second dimensions by shifting addressed plasma pixels in response to instructions provided by said computer according to said alignment information, so that said pattern is translated in at least one coplanar direction on said plasma display.

6. The system of claim 1, further comprising an optical viewer to allow optical monitoring of positioning of the object mounted in said alignment fixture by visually verifying that a pattern projected on the object is properly aligned.

7. The system of claim 1, further comprising an optical filter, removably mounted in said patterned light beam to selectively filter light impinging on the object to prevent exposure of the object during an alignment procedure.

8. The system of claim 7 wherein said optical filter is an ultraviolet (UV) filter.

9. The system of claim 1 wherein the object is a photoresist coated substrate.

10. The system of claim 1 wherein the object is a photoreactive coated substrate.

11. A method for maskless photolithography comprising:
    a. receiving mask pattern information corresponding to a desired pattern to be created on an object;
    b. generating mask patterns based on received mask pattern information;
    c. providing said mask patterns to a plasma display having individually addressable pixels, operably connected to and controllable by a computer system;
    d. generating a patterned light beam corresponding to said mask pattern;
    e. allowing exposure of an object to said patterned light beam; and
    f. repeating steps (a–e) to allow creation of a desired pattern on the object.

12. The method of claim 11, wherein said plasma display radiates ultraviolet light (UV) and does not have phosphor coatings for converting ultraviolet light (UV) to visible light.

13. The method of claim 11, further comprising collimating said patterned light beam generated by said plasma display and directing said patterned light beam onto the object.

14. The method of claim 11, further comprising providing selective filtering of said patterned light beam impinging on the object to prevent reactive exposure of the object during an alignment procedure.

15. The method of claim 14 wherein said optical filter is an UV filter.

16. The method of claim 14, wherein said providing selective filtering of said patterned light beam further comprises placing an optical filter in and removing an optical filter from said patterned light beam path.

17. The method of claim 11, further comprising:
    a. allowing manual alignment of the object under said patterned light beam by moving the object in three dimensions, wherein the object is moved in coplanar first and second dimensions, and moved in a third dimension direction substantially perpendicular to said first and second coplanar dimensions, and substantially parallel to said patterned light beam radiated from said plasma display; and
    b. allowing optical monitoring of alignment of the object under said patterned light beam to visually verify that an image projected on the object is properly aligned.

18. The method of claim 17, wherein said allowing manual alignment of the object further comprises manually aligning a object under said patterned light beam by moving the object in three dimensions in response to mechanical alignments provided by a user.

19. The method of claim 17, wherein said allowing optical monitoring further comprises optically monitoring positioning of the object under said patterned light beam to visually verify that an image projected on the object is properly aligned.

20. The method of claim 11, further comprising electronically aligning the mask patterns by:
    a. receiving alignment information corresponding to alignment of the desired mask pattern projected onto a object;
    b. generating alignment instructions based on received alignment information;
    c. providing alignment instructions, based on said alignment information, to said plasma display to further align said mask patterns in the coplanar first and second dimensions; and d. adjusting addressing of said pixels of said plasma display according to said alignment instructions by shifting the mask pattern in at least one of the coplanar first and second dimensions.

21. The method of claim 11, wherein said receiving mask pattern information further comprises providing mask pattern information corresponding to a desired pattern to be created on a object.

22. The method of claim 11 wherein the object is a photoresist coated object and successive layers are etched away from the substrate according to the projected mask pattern.

23. The method of claim 11 wherein the substrate is a photoreactive coated substrate and successive layers are added to the substrate according to the projected mask pattern.

24. A method for maskless photolithography comprising:
   a. providing a computer system for generating mask patterns; and
   b. providing a plasma display, having individually addressable pixels, operably connected to and controllable by said computer system, wherein said display generates a patterned light beam according to said mask patterns provided by said computer system, wherein said display generates a patterned light beam corresponding to said mask patterns provided by said computer system to expose an object to said patterned light beam and to create patterns on the object corresponding to said mask patterns.

25. The method of claim 24, wherein said plasma display radiates ultraviolet light (UV) and does not have phosphor coatings for converting ultraviolet light (UV) to visible light.

26. The method of claim 24, further comprising providing a computer system for generating alignment instructions, wherein said system provides instructions to align patterns in coplanar first and second dimensions, by shifting addressed plasma pixels in response to instructions provided by said computer according to said alignment information so that the pattern is translated in at least one coplanar direction.

27. The method of claim 24, further comprising providing an optical system for collimating and directing said patterned light beam onto the object.

28. The method of claim 24, further comprising providing a manually controlled alignment fixture for mounting the object, wherein said alignment fixture is movable in coplanar first and second dimensions, and in a third dimension direction substantially perpendicular to said first and second coplanar dimensions and substantially parallel to said patterned light beam radiated from said plasma display; said fixture providing three dimensional alignment of the object beneath said patterned light beam, wherein said alignment fixture is moved in three dimensions in response to mechanical alignments directly provided by a user.

29. The method of claim 24, further comprising providing an optical viewer to allow optical monitoring of positioning of the object mounted in said alignment fixture by visually verifying that an image projected on the object is properly aligned.

30. A computer system for maskless photolithography comprising:
   a. a computing device comprising a display, a central processing unit (CPU), operating system software, memory for storing data, a user interface, and input/output capability for reading and writing data; said computing device operably connected to and operating in conjunction with a maskless photolithography system;
   b. computer program code for:
      1) receiving mask pattern information corresponding to a desired pattern to be created on an object;
      2) generating mask patterns based on received mask pattern information;
      3) providing said mask patterns to a plasma display having individually addressable pixels, operably connected to and controllable by a computer system;
      4) generating a patterned light beam corresponding to said mask pattern;
      5) allowing exposure of an object to said patterned light beam; and
      6) repeating steps (1–5) to allow creation of a desired pattern on the object;
   wherein said computing device operates in conjunction with said maskless photolithography system and executes said computer code to control said plasma display according to said received pattern information.

31. The computer system of claim 30 further comprising a dedicated interface for receiving alignment information.

32. The computer system of claim 30 further comprising a dedicated interface for providing pattern information and alignment commands to a plasma display.

33. A computer program product recorded on computer readable medium for a maskless photolithography system comprising:
   a. computer readable medium for receiving mask pattern information corresponding to a desired pattern to be created on an object;
   b. computer readable medium for generating mask patterns based on received mask pattern information;
   c. computer readable medium for providing said mask patterns to a plasma display having individually addressable pixels, operably connected to and controllable by a computer system;
   d. computer readable medium for generating a patterned light beam corresponding to said mask pattern;
   e. computer readable medium for allowing exposure of an object to said patterned light beam; and
   f. computer readable medium for repeating steps (a–e) to allow creation of a desired pattern on the object;
   wherein said computer program product provides instructions for a computer system operating in conjunction with said maskless photolithography system to control said plasma display according to said received pattern information.

* * * * *